United States Patent [19]

Poliniak et al.

[11] 3,935,331

[45] Jan. 27, 1976

[54] PREPARATION OF OLEFIN SO$_2$ COPOLYMER ELECTRON BEAM RESIST FILMS AND USE OF SAME FOR RECORDING

[75] Inventors: Eugene Samuel Poliniak, Willingboro; Howard George Scheible, Livingston; Richard Joseph Himics, Skillman, all of N.J.

[73] Assignee: RCA Corporation, New York, N.Y.

[22] Filed: Jan. 9, 1975

[21] Appl. No.: 539,851

[52] U.S. Cl. .................... 427/43; 96/35.1; 96/36.2; 96/48 R; 96/115 R; 204/159.14; 260/79.3 A; 346/74 CR; 346/135; 427/44; 427/273; 427/350
[51] Int. Cl.² ...................... B05D 3/06; G11B 9/00
[58] Field of Search ............... 427/43, 44, 273, 350; 96/35.1, 36.2, 33, 48 R, 115 R; 179/100.3 C, 100.4 C; 346/1, 74 C, 135; 204/159.14; 260/79.3 A

[56] References Cited

UNITED STATES PATENTS

| 3,576,791 | 4/1971 | Holler et al. | 260/79.3 A |
|---|---|---|---|
| 3,723,591 | 3/1973 | Bauer et al. | 260/79.3 A |
| 3,884,696 | 5/1975 | Bowden et al. | 204/159.14 |

OTHER PUBLICATIONS

Thomspson et al. "J. Electrochem. Soc." Vol. 120 No. 12 Dec. 1973 pp. 1722–1726.

*Primary Examiner*—J. H. Newsome
*Attorney, Agent, or Firm*—Glenn H. Bruestle; Birgit E. Morris

[57] ABSTRACT

In preparing an electron beam resist film of a copolymer of an olefin and SO$_2$, the steps of removing insoluble particles, drying the films under high vacuum and storing them in a moisture-free atmosphere are required to prevent cracking of the films during development.

6 Claims, 6 Drawing Figures

PREPARATION OF OLEFIN SO₂ COPOLYMER ELECTRON BEAM RESIST FILMS AND USE OF SAME FOR RECORDING

This invention relates to preparation of electron beam resist films. More particularly, this invention relates to preparation of films of olefin-$SO_2$ copolymers for use as electron beam resists.

BACKGROUND OF THE INVENTION

Photoresists are thin films of light sensitive materials which, when struck by a modulated light beam carrying information, change their solubility in certain solvents in the exposed region. The films can be developed with an appropriate solvent to transfer the information contained in the light beam as a surface relief pattern in the resist film. Recently, modulated electron beams have partially replaced light beams because they can be more highly focused to form higher density patterns, on the order of 1 micron or less. However, light sensitive resist materials are not necessarily sensitive to electron beams and most of them are highly complex organic materials. Thus a search for simple organic materials which are highly sensitive to electron beams and which can be developed to form high density relief patterns has been carried out by many workers.

Olefin-$SO_2$ copolymers are known to be useful as positive electron beam resists. Investigations have been carried out by L. F. Thompson and M. J. Bowden, and reported in, inter alia, Journal Electrochem Society, Volume 20, No. 12, December 1973, pages 1722–26.

To prepare resist films of these copolymers, the copolymers are dissolved in a suitable solvent and solution cast, or, preferably, spun onto the desired substrate to form a uniform film about 0.1 to 0.5 micron thick. The solvent is removed, as by baking at 110° C. for about 0.1–0.5 hours.

The copolymer films are then exposed to the beam of a scanning electron microscope, modulated to produce a relief pattern in the resist upon development with a suitable solvent. The polymer films are then post baked for 0.5 hour at 110°C.

However, these copolymers cannot be employed when thicker resist films, on the order of 1 micron or more, are required, e.g., when the films are not to be developed through to the substrate and etched, because these films crack during solvent development. These cracks distort and even nullify the information in the developing relief pattern and have limited the use of olefin-$SO_2$ copolymer resists to applications requiring only thin films. Further, the elevated temperatures, over 100°C., employed to dry thin films cannot be employed when the substrate is sensitive to elevated temperatures. Also, prolonged heating, even at lower temperatures, e.g., about 50°C., results in deterioration and warping of the copolymer films. Thus a method of preparing the films which will avoid the use of high temperatures and will prevent cracking of the films during development has been sought.

SUMMARY OF THE INVENTION

We have found that cracking during development of exposed olefin-$SO_2$ copolymer films can be prevented by filtering the copolymer-solvent solution prior to applying to a substrate; drying to remove the solvent under a high vacuum, i.e., over $10^{-6}$ torr, after applying to the substrate; and storing the film in a dry atmosphere until it is to be exposed to an electron beam.

DETAILED DESCRIPTION OF THE INVENTION

Figure 1:
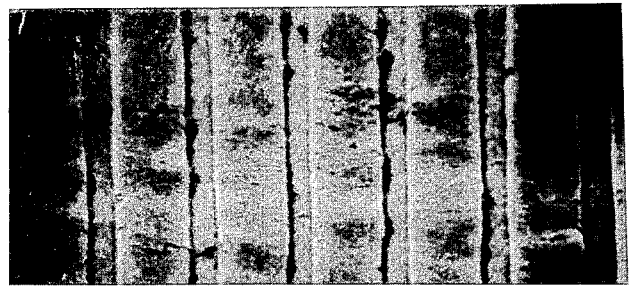
FIGS. 1–4 are photomicrographs of exposed and developed copolymer films prepared in accordance with the invention.
Figure 2:
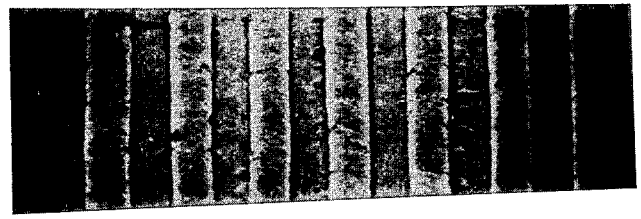
Figure 3:
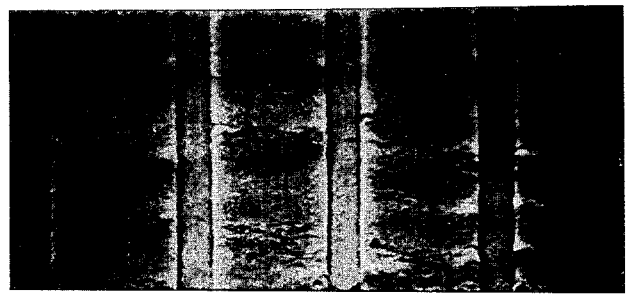
Figure 4:
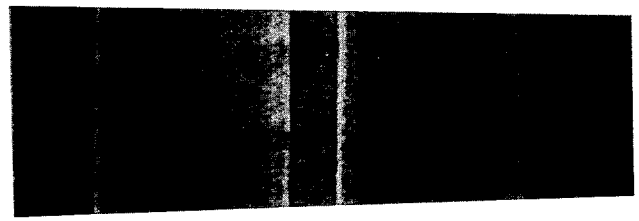

The olefin-$SO_2$ copolymers are prepared in known manner as follows: $SO_2$ is condensed in a dry ice/acetone-cooled gas trap and transferred to a suitable reaction tube. A free radical initiator such as t-butyl hydroperoxide in an effective amount is added to the liquified $SO_2$, the comonomer is added, and the reaction tube is sealed. Polymerization is allowed to proceed at temperatures of from about $-10°$ to about $-80°C$. for a period of from about 30 minutes to about 10 hours. In preparing the copolymer, an excess of up to about 4 mols of $SO_2$ per mol of comonomer can be employed. The copolymer can be purified in conventional manner if desired.

The olefin-$SO_2$ copolymers are soluble in various solvents including, for example, dimethylsulfoxide, methyl ethyl ketone, toluene, xylene, dioxane, chlorobenzene, chloroform, ethyl acetate, dimethylformamide and the like.

The olefin-$SO_2$ copolymer to be employed as the resist is dissolved in a suitable solvent and microfiltered to remove any insoluble or gelled copolymer or foreign particles. A filter that removes particles larger than about 0.2 micron is suitable.

The filtered copolymer solution is then applied to the substrate to be coated, as by spinning or solution casting. The thickness of the resultant film can be adjusted by altering the concentration of the resist in the solvent, which alters the viscosity, and by varying the spinning speed.

The wet film on the substrate is next placed in a vacuum chamber which is evacuated to a high vacuum of at least $10^{-6}$ torr. The time for vacuum evaporation of the solvent will vary depending on the boiling point of the solvent, the thickness of the film and the like. In general, from about 12 to about 18 hours will be required to remove the solvent in films having a final thickness of about 0.3 to about 1.5 microns.

If the dry films are to be stored after removal from the vacuum chamber, storage must be in a moisture-free environment. Water is absorbed by the films after only a few hours exposure in sufficient amount to cause film cracking during development.

Prior to exposure, an electrically conductive layer must be provided to remove the charge after electron beam exposure. In the event that the support is nonconducting, a thin conductive film is applied either to the support prior to coating with the resist, or, applied to the surface of the prepared recording medium. This conductive film can be conductive coated glass, such as tin oxide or indium oxide coated glass, glass having a conductive metal film thereon and the like. Alternatively, an electron permeable conductive layer can be formed on the polymer film by vapor deposition of a thin film of copper, nickel, aluminum, chromium or other conductive metal or alloy in known manner. The conductive layer is suitably from about 50 to 10,000A, preferably 100 to 1000 A, in thickness.

The recording medium comprising the copolymer film on a support is then exposed to a modulated electron beam. A variable speed scanning electron microscope is employed in known manner to record the desired information in the copolymer film.

After exposure, the recording medium is developed by immersing in or spraying with a suitable solvent developer. The optimum solvent for each copolymer film can be determined empirically. Suitable solvents include for example acetone, mixtures of acetone with acetonyl acetate, methyl ethyl ketone, 2-methylcyclohexanone, 3-methycycylohexanone, cyclohexanone, diisobutyl ketone, methanol, propanol, xylene, dioxane, tetrachloroethane, dimethylformamide, acetonitrile and mixtures of such solvents. Very fast working solvents are preferably diluted with nonsolvents to decrease the rate of dissolution and avoid undue dissolution of unexposed portions of the resist film.

The combination of the steps of: filtering the copolymer solution to 0.2 micron to remove any solid impurities or gel particles prior to deposition on the substrate; drying the films under high vacuum; and storing the films in a dry atmosphere, are required to prevent cracking of thick olefin-$SO_2$ copolymer films during development. If the copolymer films are dried by evaporating at normal or elevated temperatures, the cracking problem occurs. Further, even when the films are dried under high vacuum, if they are exposed to moisture thereafter, the films crack during development. Conventional evaporation at elevated temperature and storage in a dry atmosphere without vacuum drying does not eliminate subsequent cracking.

The invention will be further illustrated by the following example. However, it is to be understood that the invention is not meant to be limited to the details described therein.

EXAMPLE

A solution containing 10% by weight of a copolymer having a molecular weight of about 175,000 derived from 1-methylcyclopentene and $SO_2$, in cyclopentanone was filtered successively through 5.0, 1.0, 0.5 and 0.2 micron filters. The filtered solution was spun at 1,000 rpm onto glass plates coated with a thin film of chromium-nickel. The resultant copolymer films were about 1 micron thick.

The glass plates were dried by placing in a vacuum chamber which was evacuated to a pressure of $10^{-6}$ torr for 18 hours. The dried plates were stored for several days in a desiccator.

The films were exposed to the beam of a scanning electron microscope at an accelerating potential of about 10 kV and a beam current of 3 nA. An approximately Gaussian shaped beam having a full width at one-half amplitude of about 0.5 micron was scanned to describe rasters on the surface of the films at various speeds, thereby varying the total exposure of the films to the beam.

The samples were developed by immersing in 2-methylcyclohexanone for 2 minutes.

FIGS. 1–4 are photomicrographs which show the raster patterns developed at current densities of 1.3, 2.3, 6.7 and 26 microcoulombs/$cm^2$ respectively.

Figure 5:
FIG. 5 is a photomicrograph of an exposed and developed copolymer film dried in air.

A comparison was made with a film of the above copolymer which was dried by prior art techniques of exposing to air at room temperature. FIG. 5 is a photomicrograph of the prior art developed film exposed at a current density of 2.0 microcoulombs/$cm^2$. The extensive cracking is readily apparent.

Figure 6:
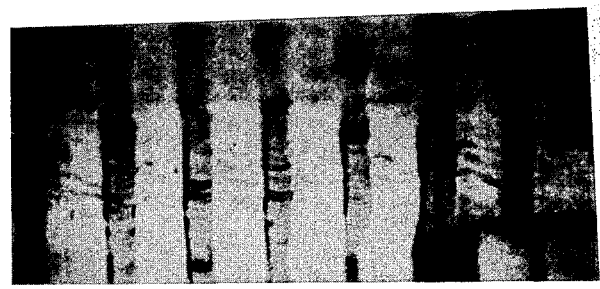
FIG. 6 is a photomicrograph of an exposed and developed copolymer film dried at 50°C.

Another comparison was made with a film of the above copolymer which was dried by prior art techniques of heating in air at 50°C. for 3 hours. FIG. 6 is a photomicrograph of the prior art developed film exposed at a current density of 5.6 microcoulombs/$cm^2$. Warping and deterioration of the film are apparent.

We claim:

1. A method of preparing an electron beam recording medium comprising a film of a copolymer of $SO_2$ and an olefin on a substrate which comprises
    a. dissolving said copolymer in a solvent,
    b. filtering the resultant solution through a filter having apertures on the order of 0.2 micron or smaller,
    c. applying a copolymer film from said solution onto said substrate,
    d. drying said film in a vacuum of at least $10^{-6}$ torr until said solvent is removed, and
    e. maintaining said dried film moisture-free until it is exposed to an electron beam.

2. A method according to claim 1 wherein the copolymer is a copolymer of 1-methylcyclopentene and $SO_2$.

3. A method according to claim 1 wherein the copolymer film is from about 0.3 to about 1.5 microns thick.

4. A method according to claim 3 wherein drying is continued for from about 12 to about 18 hours.

5. A method of recording information in the form of a relief pattern which comprises
    a. dissolving a copolymer of $SO_2$ and an olefin in a solvent,
    b. filtering the resultant solution through a filter having apertures on the order of 0.2 micron or smaller,
    c. applying a copolymer film from said solution onto a substrate,
    d. drying said film in a vacuum of at least $10^{-6}$ torr until said solvent is removed,
    e. maintaining said dried film moisture-free until it is exposed to an electron beam,
    f. exposing said film to a modulated beam of electrons, and
    g. developing said film by dissolving the exposed portions in a solvent to form said relief pattern.

6. A method according to claim 5 wherein said copolymer is a copolymer of 1-methylcyclopentene and $SO_2$.

* * * * *